United States Patent [19]
Van Der Valk

[11] Patent Number: 5,237,284
[45] Date of Patent: Aug. 17, 1993

[54] MEASUREMENT OF CAPACITANCE AND PARAMETERS RELATED THERETO FOR DETERMINING DISPLACEMENT

[75] Inventor: Rob Van Der Valk, London, England

[73] Assignee: Presidium Promotions Limited, London, United Kingdom

[21] Appl. No.: 671,818

[22] PCT Filed: Sep. 12, 1989

[86] PCT No.: PCT/GB89/01072

§ 371 Date: Apr. 3, 1991

§ 102(e) Date: Apr. 3, 1991

[87] PCT Pub. No.: WO90/02923

PCT Pub. Date: Mar. 22, 1990

[30] Foreign Application Priority Data

Sep. 14, 1988 [GB] United Kingdom ............... 8821512

[51] Int. Cl.$^5$ .................. G01R 27/26; G08C 19/10
[52] U.S. Cl. ..................... 324/662; 324/660; 324/686; 340/870.37; 73/780
[58] Field of Search .............. 324/660, 661, 662, 676, 324/678, 679, 686; 340/870.37; 73/780, 718, 724

[56] References Cited

U.S. PATENT DOCUMENTS

| | | | |
|---|---|---|---|
| 3,071,758 | 1/1963 | Wolfendale | 340/187 |
| 3,297,941 | 1/1967 | Wolfendale | 340/870.37 |
| 3,566,222 | 2/1971 | Wolfendale | 317/246 |
| 3,668,672 | 6/1972 | Parnell | 340/200 |
| 3,683,402 | 8/1972 | Parnell | 346/32 |
| 3,777,257 | 12/1973 | Geisselmann | 324/663 |
| 3,857,092 | 12/1974 | Meyer | 324/662 |
| 3,873,916 | 3/1975 | Sterki | 340/870.37 |
| 3,938,113 | 2/1976 | Dobson | 340/870.37 |
| 4,217,543 | 8/1980 | Strong | 324/678 X |
| 4,241,995 | 12/1980 | Takahama | 324/83 D |
| 4,347,478 | 8/1982 | Heerens et al. | 324/61 R |
| 4,350,981 | 9/1982 | Tanaka et al. | 324/660 |
| 4,420,754 | 12/1983 | Andermo | 324/660 |
| 4,437,055 | 3/1984 | Meyer | 324/662 |
| 4,543,562 | 9/1985 | Burckhart et al. | 324/660 X |
| 4,743,902 | 5/1988 | Andermo | 324/870.37 |

FOREIGN PATENT DOCUMENTS

| | | |
|---|---|---|
| 0023732 | 11/1984 | European Pat. Off. . |
| 0053091 | 3/1986 | European Pat. Off. . |
| 953745 | 12/1956 | Fed. Rep. of Germany . |
| 1599174 | 8/1970 | France . |
| 539837 | 9/1973 | Switzerland . |
| 1190469 | 5/1970 | United Kingdom . |
| 2014721 | 8/1979 | United Kingdom . |
| 2015167 | 9/1979 | United Kingdom . |
| 2020815 | 11/1979 | United Kingdom . |
| 2022840 | 12/1979 | United Kingdom . |
| 2032116 | 4/1980 | United Kingdom . |
| 2035569 | 6/1980 | United Kingdom . |
| 2046920 | 11/1980 | United Kingdom . |
| 2076070 | 12/1981 | United Kingdom . |

*Primary Examiner*—Gerard R. Strecker
*Assistant Examiner*—Diep Do
*Attorney, Agent, or Firm*—Christie, Parker & Hale

[57] ABSTRACT

A displacement measurement apparatus includes a primary electrode, and first and second secondary electrodes which are closely spaced apart and together fully span the primary electrode, the primary and secondary electrodes being movable relative to one another without increasing their transverse separation. A charge pumping means is arranged to supply electric charge to the primary electrode through the first secondary electrode during selected first clock periods, and to withdraw charge from the primary electrode through the second secondary electrode during selected second clock periods. The changeover from one mode of operation to the other is made automatically when the sign of the charge on the primary electrode reverses, so that the charge on the primary electrode is successively increased, and then reduced to a low value. The numbers N1 and N2 of charge packets supplied to and withdrawn from the primary electrode during a measurement cycle are counted, and a displacement signal is produced in accordance with the relationship (N1−N2)/N1. The electrical system may also be used for determining in a similar manner the ratio of the capacitances of any two capacitors.

26 Claims, 3 Drawing Sheets

MEASUREMENT OF CAPACITANCE AND PARAMETERS RELATED THERETO FOR DETERMINING DISPLACEMENT

This invention relates to an apparatus for and a method of measuring the capacitance of capacitors, and parameters related thereto; and more particularly to such an apparatus and method for measuring the displacement of a movable object by measuring the electrical capacitance between two electrode systems one of which is movable by such an object relative to the other electrode system.

In a prior apparatus of that kind, a plate electrode of one electrode system has been disposed face-to-face with, but spaced from, plate electrodes of a second electrode system, and the electrodes of the two systems have been relatively movable in their own planes so as to alter the dispositions of the electrode systems relative to one another without altering the transverse separation of the two electrode systems, and means have been provided for sensing changes in the electrical capacitance between the electrode systems as the displacement of the two systems has been changed.

U.S. Pat. No. 4,437,055 (MEYER) discloses such a capacitive displacement measurement apparatus in which a displacement sensor comprises (a) a flat-plate primary electrode which opposes a plurality of uniformly-spaced, co-planar, smaller flat-plate secondary electrodes, at constant spatial separation, and (b) an electronic circuit means arranged to detect the displacement of the primary electrode from a central position relative to the secondary electrodes as a change in the distribution of capacitive currents flowing to and from the primary electrode when the secondary electrodes on either side of a central secondary electrode are oppositely energised in a predetermined cyclic manner. This is achieved by progressively and cyclically varying a balancing voltage applied to the central secondary electrode between the respective voltages currently applied to the adjoining secondary electrodes, and noting the magnitude of the balancing voltage, or its phase, when the net current flow to the primary electrode falls to zero value in each measurement cycle.

In order to accommodate a large range of displacement measurement, the secondary electrode system is repeated, and electronic switching means are provided for transfering the respective energising and balancing voltages progressively along the sequence of secondary electrodes as the primary electrode progresses along that secondary electrode sequence.

The present invention seeks to provide inter alia an advantageous alternative approach to the determination with high accuracy of the displacement of an object, using fewer secondary electrodes and less complex electrical circuitry.

According to a first aspect of the present invention, there is provided a capacitive displacement measurement apparatus which includes two mutually-opposed electrode systems spaced transversely apart, one such system being displacable relative to the other without changing the transverse spacing of the electrode systems, which apparatus is characterised by:

(a) one such system (called hereafter the primary electrode system) comprising a single primary electrode plate, and the other electrode system (called hereafter the secondary electrode system) comprising two similar secondary electrode plates which are closely spaced apart, which together span fully or substantially so the whole of the primary electrode plate, and which on relative displacement of the two electrode systems suffers a progressive reduction in the overlap of the primary electrode first with one secondary electrode and then with the second secondary electrode;

(b) clock means for providing a succession of clock pulses defining successive clock periods;

(c) electric charge pumping means arranged when operating in a first mode to supply to the primary electrode via a first one of the secondary electrodes first predetermined packets of electrical charge during selected first clock periods so as to increase the electric charge on the primary electrode, and when operating in a second mode to withdraw from the primary electrode via the second of the secondary electrodes second predetermined packets of electrical charge during selected second clock periods so as to decrease the electric charge on the primary electrode;

(d) charge monitoring means for monitoring the level of electric charge present on the primary electrode, and for causing the charge pumping means to operate in the first mode whenever at the end of a said second clock period the charge present on the primary electrode has fallen below a predetermined datum level, and to operate in the second mode whenever at the end of a said first clock period the charge present on the primary electrode has risen above the said datum level;

(e) charge summating means for summating during each cycle during which a displacement measurement is made (i) the charge supplied to the primary electrode via the first secondary electrode, and (ii) the charge withdrawn from the primary electrode via the second secondary electrode, and for providing at the end of each measurement cycle electric signals N2 and N1 representing the respective summations of the charges supplied to and withdrawn from the primary electrode; and (f) signal converting means for converting the signals N1 and N2 into a displacement signal which is directly indicative of the displacement of one of the two electrode systems relative to the other.

In one preferred embodiment, the said first predetermined packets of electrical charge and the said second predetermined packets of electrical charge are all of constant uniform magnitude, and the said charge summating means comprises a charge packet counting means arranged for counting during each predetermined displacement-measurement cycle the respective charge packets supplied to and withdrawn from the primary electrode, thereby to provide at the end of each measurement cycle said electric signals N1 and N2.

Furthermore, in such an apparatus, a displacement direction device is arranged to provide a direction signal in dependence upon whichever of the two signals N1 and N2 is the larger, i.e. in dependence upon whether the ratio N1/N2 is larger or smaller than unity.

In one preferred embodiment of the present invention, the summating means is arranged to stop summating the charge supplied to and withdrawn from the primary electrode, and to terminate the measurement cycle, whenever one or the other of the two signals N1 and N2 first reaches a predetermined datum value. In that case, the direction signal is provided by the count that reaches the datum value, whilst the other count (the smaller count) is indicative of the magnitude of the measured displacement, and is converted by the signal converting means so as to produce therefrom a displacement signal.

According to another feature of the present invention, the secondary electrode system includes at either end thereof other similar secondary electrodes which are spaced from adjacent secondary electrodes in like manner as the first and second secondary electrodes, and electrode switching means are arranged to connect the charge pumping means in succession to different pairs of secondary electrodes as the primary electrodes moves adjacent different pairs of adjacent secondary electrodes.

Preferably, the electrode switching means is arranged to transfer the charge pumping means from one pair of secondary electrodes to a next pair whenever the ratio of the count signals N1 and N2 moves through a predetermined datum value corresponding to a displacement of approximately one half of the pitch of the secondary electrodes.

According to another feature of the present invention, means are provided for incrementing an output signal indicative of the displacement by one secondary electrode pitch each time the ratio of the signals progressively increasing towards the values N1 and N2 during any measurement cycle exceeds a predetermined value, of the order of three of four, which indicates a rapid change in the monitored displacement.

According to yet another feature of the present invention, the apparatus is arranged so that after the end of each measurement cycle it functions in an alternative manner in which:

(a) the electric charge pumping means transports (that is, supplies or withdraws) electric charge in successive clock periods at progressively lower rates of charge transport;

(b) the electric charge pumping means operates in either a third mode or a fourth mode, in which third mode the electric charge pumping means supplies charge to the primary electrode in selected third clock periods via the first secondary electrode, and in which fourth mode the charge pumping means withdraws charge from the primary electrode in selected fourth clock periods via the first secondary electrode;

(c) the charge monitoring means causes the charge pumping means to operate in the third mode whenever at the end of a said fourth clock period the charge present on the primary electrode has fallen below a predetermined datum level and to operate in the fourth mode whenever at the end of a said third clock period the charge present on the primary electrode has risen above that datum level; and (d) the charge summating means summates the charge supplied to and withdrawn from the primary electrode via the first secondary electrode; there being provided- an additional signal producing means which is responsive to the changes in mode and the rates at which the charge pumping means supplies charge to and withdraws charge from the primary electrode in the third and fourth modes, and which produces therefrom a summation signal representative of the residual charge present at the primary electrode at the end of the preceding measurement cycle.

According to a second aspect of the present invention, a method of determining the displacement of an object includes the step of providing two mutually-opposed electrode systems spaced transversely apart, one such system being displacable with said object relative to the other electrode system without changing the transverse spacing of the electrode systems, and the other electrode system being held stationary; and the method is characterised in that:

(i) one such system (called hereafter the primary electrode system) comprises a single primary electrode plate, and the other electrode system (called hereafter the secondary electrode system) comprises two similar secondary electrode plates which are closely spaced apart, which together span fully or substantially so the whole of the primary electrode plate, and which on relative displacement of the two electrode systems suffers a progressive reduction in the overlap of the primary electrode first with one secondary electrode and then with the second secondary electrode; and (ii) the method comprises, in a measurement cycle comprising a number of clock periods, the steps of:

(a) supplying electric charge to the primary electrode via the first secondary electrode during a selected first clock period whereby to increase the electric charge on the primary electrode;

(b) withdrawing electric charge from the primary electrode during selected successive second clock periods via the second secondary electrode whereby to decrease the electric charge on the primary electrode;

(c) detecting when the sign of the electric charge on the primary electrode charges, and thereupon causing the steps (a) and (b) above to be repeated until after a number of clock periods the end of the measurement cycle has been reached;

(d) summating during the measurement cycle the charge supplied during the clock periods occupied by steps (a) and providing a signal N2 representative of that summated charge;

(e) summating during the measurement cycle the charge withdrawn during the clock periods occupied by steps (b) and providing a signal N1 representative of that summated charge; and (f) determining at the end of each measurement cycle from the ration (N1-N2)/N1 the value of the relative displacement of the secondary electrodes from their central starting position in which they span fully or substantially so the primary electrode.

In a preferred method, charge is supplied in the steps (a) and withdrawn in the steps (b) under a predetermined uniform voltage; said step (d) comprises counting during the measurement cycle the number of clock periods occupied by steps (a); and said step (e) comprises counting during the measurement cycle the number of clock periods occupied by steps (b).

According to another feature of this second aspect of the present invention, the method includes the step of stopping the measurement cycle when the greater of the signals N2 and N1 reaches a predetermined datum level, and producing from the signal N1 or N2 reaching that datum level a first output signal indicating the sense of the displacement of the secondary electrodes from the central position, and from the value of the smaller signal a second output signal indicating the magnitude of the displacement.

According to yet another feature of this second aspect of the present invention, the method also includes, where the number of secondary electrodes is greater than two, the step of transferring to a different pair of adjacent secondary electrodes when the ratio of the numbers N1 and N2 crosses a predetermined threshold value indicative of a displacement of approximately one half the pitch of the secondary electrodes.

According to a further feature of this second aspect of the present invention, the method also includes under conditions of rapid displacement of the electrode systems, the step of changing an output signal indicative of the displacement by one pitch of the secondary electrodes each time the ratio of the two signals progressively approaching the values N1 and N2 respectively during any measurement cycle exceeds a predetermined high value of the order of three or four.

According to a still further feature of this second aspect of the present invention, the method also includes after the end of each said measurement cycle, the additional steps of (a) transporting electric charge in successive clock periods at progressively lower rates of charge transport, in either a third mode or a fourth mode, in which third mode the electric charge pumping means supplies charge to the primary electrode in selected third clock periods via the first secondary electrode, and in which fourth mode the charge pumping means withdraws charge from the primary electrode in selected fourth clock periods via the first secondary electrode;

(b) detecting when the sign of the electric charge on the primary electrode changes, and thereupon effecting a change from one of said third and fourth modes to the other of those modes thereby to progressively reduce the charge present at the primary electrode towards zero value; and (c) producing in response to said changes of mode and said progressively reducing transport rates a signal representative of the residual charge remaining on the primary electrode at the end of the preceding measurement cycle.

According to a further aspect of the present invention, there is provided an apparatus for and a method of measuring the capacitance ratio of two capacitors each having primary and secondary electrodes, the respective primary electrodes being connected to form at least for the time being a single primary electrode for the purposes of performing the measurement by means of a measurement technique referred to above and below in respect of the other aspects of the present invention.

Other features of the present invention will appear from the description that follows hereafter, and from the claims appended at the end of that description.

One calliper measurement system embodying a capacitance displacement sensor according to the present invention will now be described by way of example and with reference to the accompanying diagrammatic drawings. In those drawings:

FIG. 1 shows a schematic diagram of both the mechanical and electrical parts of the measurement system, with a constituent electrode system being shown end on;

Figure 1:
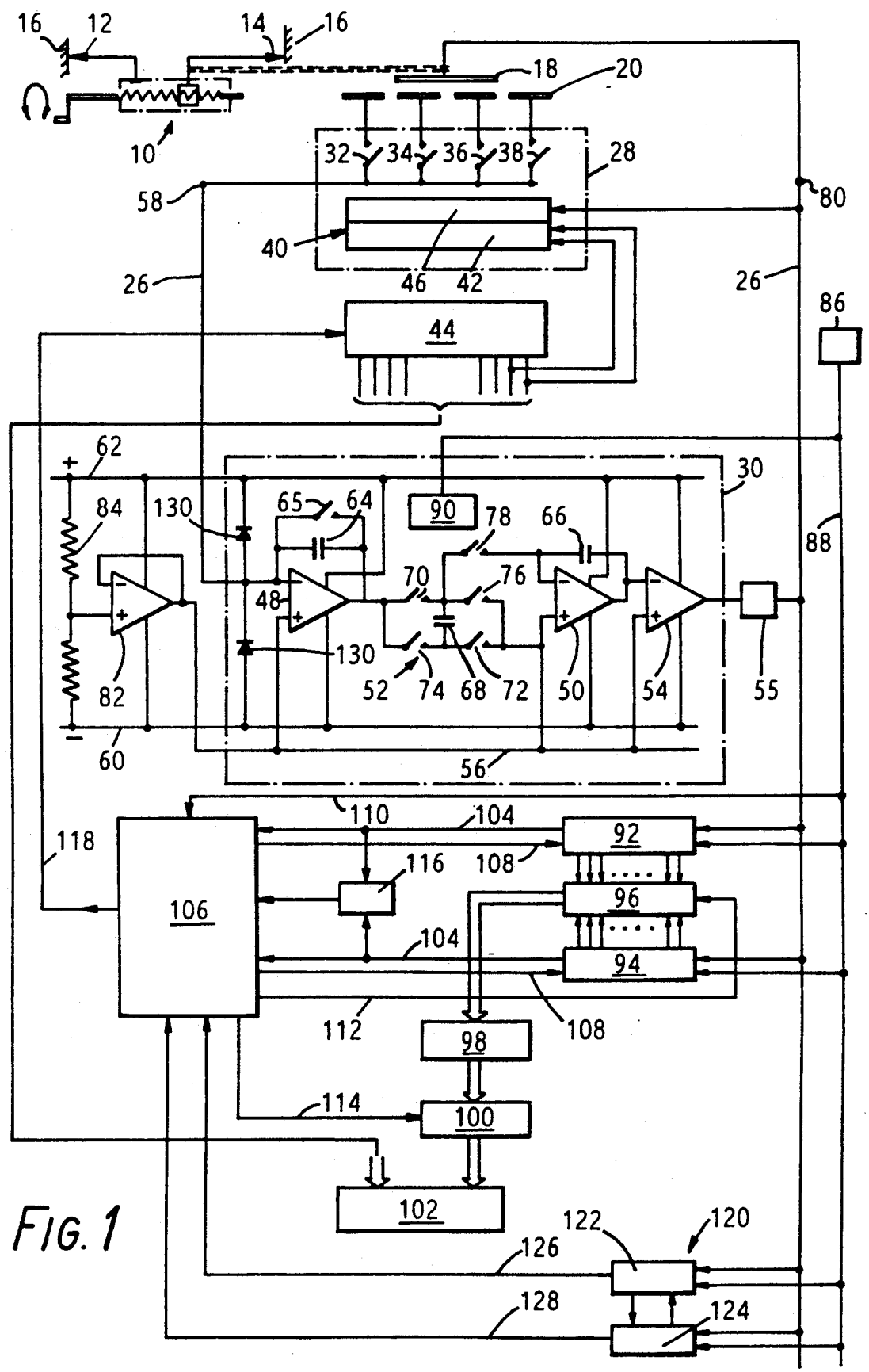

Referring now to the drawings, FIG. 1 shows an internal calliper system 10 which comprises a fixed anvil 12 and a relatively movable anvil 14 for measuring internal dimensions of an object 16. The movable anvil is displacable, for example, by means of a hand-wound screw and nut drive 17 and is connected with and drives a flat plate electrode 18 (the primary electrode) along a linear path which is parallel with an array of smaller, uniformly-spaced, flat-plate electrodes 20 (the secondary electrodes). The secondary electrodes 20 are of equal width 'a', as best shown in the FIG. 2, and have mutual separation distances 'h'. The primary electrode 18 has a width of 'b', and spans completely two secondary electrodes, so that $b=(2a+h)$. The primary electrode is spaced from the secondary electrode system by a distance 'd', which is small compared with the dimensions 'a' and 'b'. The primary and secondary electrodes have the same dimension normal to the plane of the diagram.

Typical values, in millimeters, for the parameters 'a', 'b', 'h' and 'd' are as follows:

$a=2.38125$ (15/160");
$b=4.92$ (31/160");
$h=0.15875$ (1/160"); and
$d=0.2$ (5/640").

Figure 2:
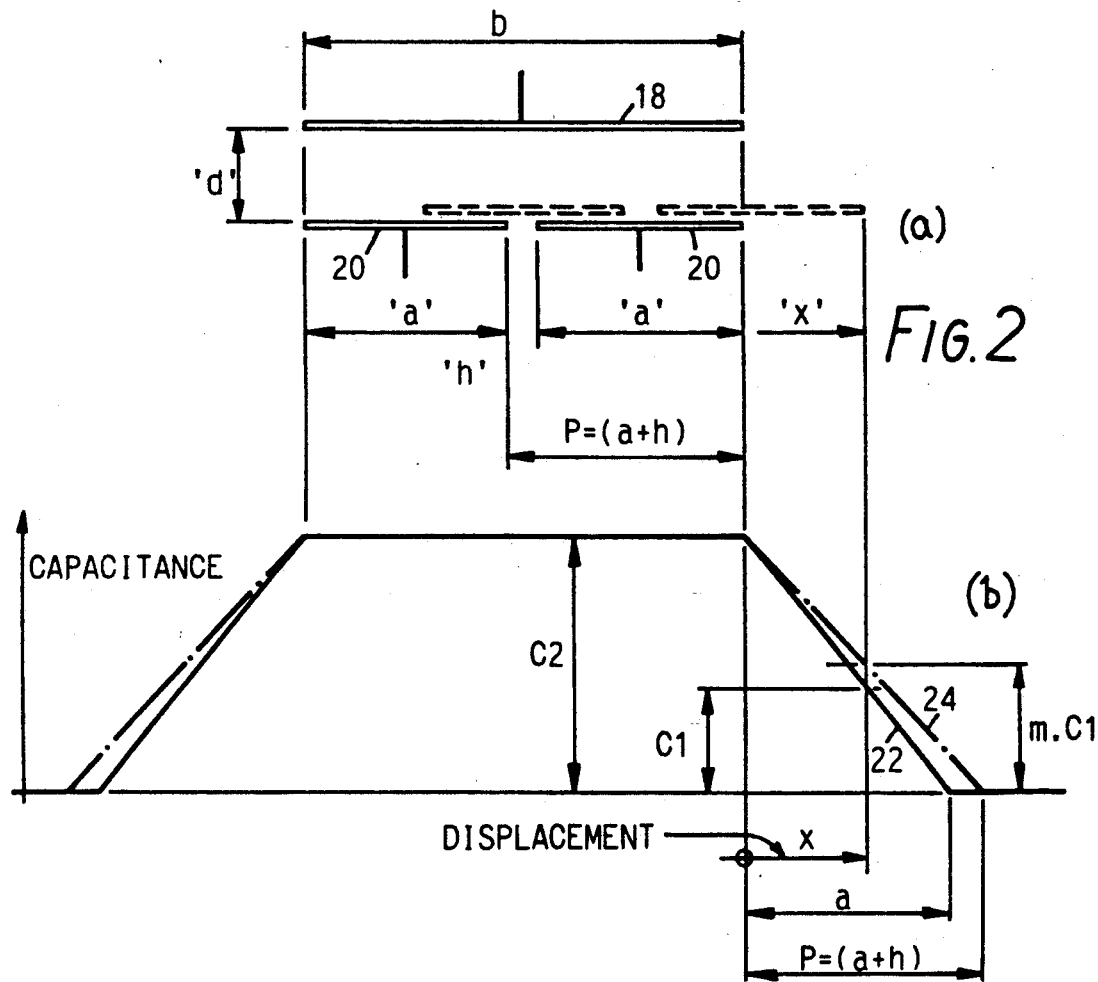
FIG. 2 shows at (a) an enlarged end-on view of the electrode system, showing more clearly the opposed primary and secondary electrodes constituting that system and their relative dimensions, and at (b) a graph showing the manner in which the capacitance between a primary electrode and the respective secondary electrodes varies with relative displacement of the electrode systems.

With the above-stated relationship between the parameters 'a', 'b', and 'h', as any secondary electrode moves progressively from a position in which it fully overlaps the primary electrode to other positions in which has only a partial overlap with the primary electrode, the decline of capacitance between it and the primary electrode with decline in overlap is substantially linear, as indicated in the FIG. 2 by the full line 22, over a range of displacement 'x' equal to the secondary electrode width 'a'. Thereafter, for the remaining distance 'h' of the secondary electrode pitch 'P', where $P=(a+h)$, the capacitance remains of zero value. In FIG. 2, the chain-dotted line 24 indicates a desired linear relationship between capacitance and displacement 'x' over one whole secondary electrode pitch 'P'.

If the capacitance between a secondary electrode and the primary electrode when in fully overlapping relationship is C2, and when in a partially overlapping relationship is C1, the value of C1 is given by the expression $$C1 = C2.(1-x/a).$$

The embodiment of the present invention which is about to be described is based on the appreciation of the fact that with such an arrangement of electrodes, displacement of the secondary electrodes from a position of full overlap with the primary electrode can be ascertained on the following basis.

If in a measurement period a number (N2) of packets of electrical charge is delivered to the primary electrode, under predetermined conditions of applied voltage, via the secondary electrode having full overlap with the primary electrode (that is through the capacitance C2), the charge remaining on the primary electrode will be zero after a related larger number (N1) of packets of charge has been withdrawn from the primary electrode via the adjacent, partially overlapping secondary electrode under the same conditions of applied voltage (that is through the capacitance C1).

Since the total charge on a capacitor is given by the expression '$Q = C \cdot V$' (where 'C' is the capacitance and 'V' the voltage developed across the capacitor), it follows that for the same voltage conditions, when all of the charge has been withdrawn $(N1 \cdot C1) = (N2 \cdot C2)$. So that $N2/N1 = C1/C2$.

It follows from the earlier quoted relationship governing C1 and C2, that:

$$N2/N1 = (1 - x/a)$$

so that:

$$x/a = (N1 - N2)/N1.$$

Hence the displacement 'x' of a secondary electrode from a fully overlapping position to a partially overlapping position relative to the primary electrode is indicated by the ratio $(N1 - N2)/N1$, since 'a' is a constant.

Furthermore, to increase this numerical displacement value 'x', derived from the linear relationship extending over the width 'a' of a secondary electrode (that is, from the full line 22 in the FIG. 2), to a value determined according to a linear relationship extending over the whole secondary electrode pitch '(a+h)', (that is, to the chain-dotted line 24 in FIG. 2), multiplier based on the values on 'a' and 'h' can be used to provide the desired displacement output signal which is truly proportional to the displacement measured in relation to the secondary electrode pitch 'P'.

However, in the range where the displacement is greater than 'a', no such signal is available from multiplication. Hence, before that displacement range is reached, a transfer is made from the secondary electrode having a decreasing overlap with the primary electrode to the other secondary electrode then having an increasing overlap with the primary electrode. Such a transfer is made when the numerical value 'x' has a mid-range value. In the preferred arrangement, the transfer is made when the detected ratio N1/N2 exceeds the value $2 \cdot (a+h)/a$, that is when the value N1 exceeds $2 \cdot (a+h)/a \cdot N2$.

The determination of the value 'x' is rendered a simpler if the counting of the numbers N1 and N2 is arranged to terminate automatically when one of those numbers reaches a predetermined datum level. Whichever number reaches the datum level indicates the direction in which the displacement of the primary electrode has taken place, whilst the other number then indicates the magnitude of the displacement from the fully overlapping condition in which the displacement 'x' equals zero.

To cater for conditions of extremely rapid changes in displacement such that the normal means of measuring the displacement cannot respond fast enough in the time available, a fast movement detector is arranged to monitor the ratio of the numbers progressively increasing towards the values N1 and N2 during any measurement cycle, or part thereof, and to provide and output signal whenever that ratio exceeds a threshold value of three or four. That output signal is used to add to or subtract from, as appropriate, an output signal representing the displacement of the object an amount corresponding to one secondary electrode pitch.

Returning now to the FIG. 1, the primary and secondary electrodes 18 and 20 are connected in a sensor energizing circuit 26 which includes in series relationship with those electrodes an electrode switching means 28 and a charge producing (pumping) circuit 30. The switching means 28 includes individual switches 32-38 through which charge may be passed to or from the respective secondary electrodes 20, and a selector means 40 for determining which pair of switches (32,34; 34,36; 36,38; or 38,32) shall be in use at any given time, and which one of the pair of the in-use switches shall be closed at any given time.

That selector means 40 includes a two-of-four decoder 42 which receives its input signals from the two lower-order outputs of an up/down (N-bit) counter 44 for determining the pair of in-use switches, and a 'left/right' changeover means 46 which receives its input signals from the output circuit of the charge producing means 30 for changing over from one switch (e.g. the left hand one) of the selected pair to the other (e.g. the right hand one) as required by the sign of the output of the charge producing means.

The charge producing circuit 30 comprises in serial relationship (a) first and second operational amplifiers 48, 50, interconnected by a charge modulator 52, (b) a comparator 54, and (c) a delayed flip-flop 55.

The first amplifier 48 has (a) an input signal circuit which is connected between a 'virtual earth' line 56 and a sensor energisation terminal 58 which is associated via the electrode selector means 28 with the secondary electrodes 20, (b) a supply circuit connected between supply source terminals 60 (−), 62 (+), (c) a feedback capacitor 64, and (d) an offset reduction switch 65 connected in parallel with the capacitor 64.

The second amplifier 50 has (a) an input circuit which is connected between the virtual earth line 56 and an output circuit of the charge modulator 52, (b) a supply circuit which is likewise connected between the supply source terminals 60, 62, and (c) a charge accumulating capacitor 66.

The charge modulator 52 comprises (a) a capacitor 68, (b) two pairs of reversing switches 70, 72 and 74, 76 for connecting the capacitor 68 in one direction or the other between the output circuit of the amplifier 48 and the virtual earth line 56, and (c) a switch 78 for connecting the capacitor 68 to the output terminal of the charge modulator, and hence to the input of the amplifier 50. Switch 72 also serves in conjunction with switch 78 to connect the capacitor 68 across the input circuit of the comparator.

The comparator 54 has (a) an input circuit connected between the virtual earth line 56 and the output of the second amplifier 50, (b) a supply circuit which is likewise connected between the supply source terminals 60, 62, and (c) an output circuit which is connected via the delayed flip-flop 55 to a second sensor energisation terminal 80 which is associated with the primary electrode 18.

The virtual earth line 56 is supplied by an operational amplifier 82 having (a) an input circuit connected to a centre tapping on a resistor divider 84 which is itself connected between the supply terminals 60, 62, and (b) a supply circuit likewise connected between those supply terminals 60, 62.

A clock pulse generator 86 provides on a clock circuit 88 clock pulses having positive and negative phases of equal duration.

The charge producing circuit 30 also includes switch control means 90 connected to receive clock pulses via the clock line 88, and arranged to perform in response thereto a sequence of switching operations in which the capacitor 68 is (a) first charged in one direction or the other during a positive clock phase, by closure of the switches 70, 72 or 74, 76 in dependence upon the polarity of the output of the charge producing circuit 30 during the preceding negative clock period, and (b) is then connected during the subsequent negative clock phase in series between the input terminals of the second amplifier 50, by closure of the switches 72 and 78, so as to either supply charge to the second amplifier input circuit and capacitor 66, or to withdraw charge therefrom.

Two counters 92, 94 are connected to receive (a) the voltage pulses applied by the charge producing means 30 to the sensor energisation terminal 80, and (b) the clock pulses supplied on the clock line 88. Counter 92 is arranged to respond to and count only the positive voltage pulses applied to terminal 80 during a clock period, whilst counter 94 is arranged to respond to and count only the negative voltage pulses applied to the terminal 80 during a clock period.

The outputs of the two counters are connected to a selector 96, and the output of that unit is supplied to a multiplication unit 98, which in turn feeds a staticising (latch) device 100. That device is arranged to store and retain a set of signals supplied to it during one measurement period until the next set of signals is received during the next measurement period. The output of the device 100 is supplied to a display device 102, and determines the lower order bits of the displacement value displayed thereby.

Each of the counters has (a) an output circuit 104 connected to a control logic unit 106 for sending to the logic unit a control signal whenever its count reaches a predetermined datum level, and (b) an input control circuit 108 for receiving 'cease counting' signals from the logic unit whenever that unit receives from the other counter a 'datum count reached' signal.

The logic unit 106 has also a clock input circuit 110, and output circuits 112, 114 for supplying control signals to the selector 96 and the staticising device 100.

The output circuits of the two counters 92, 94 are also connected to a 'secondary electrode pair' selector 116, which is arranged to monitor during each clock period the ratio of the counts N1 and N2 of the counters and to supply alternative 'left' or 'right' output signals to the logic unit 106 whenever the ratio N1/N2 or the ratio N2/N1 respectively exceeds a predetermined datum value equal to $[2 \cdot (a+h)/a]$. In response thereto, the logic unit supplies via an output circuit 118 an incrementing signal or a decrementing signal respectively to the up/down counter 44, whereby to effect transfer from one pair of secondary electrodes to the next pair in the appropriate direction.

A 'fast movement' circuit 120 comprises two synchronous resettable, two-bit counters 122, 124 each connected to receive the output voltage pulses applied to the sensor energisation terminal 80 and clock pulses from line 88, and each arranged to supply resetting signals to the other of the two counters 122, 124 whenever its own count is increased by one, and to provide at its output circuit 126, 128 an output (carry) signal whenever its count reaches 'four'. The output circuits are connected to the logic unit 106, which in response to a signal received via circuit 126 transmits an incrementing signal to the up/down counter 44, and in response to a signal received via the circuit 128 transmits a decrementing signal to that counter, whereby to effect transfer from one pair of secondary electrodes to the next pair in the appropriate direction.

In the charge producing circuit 30:

(1) the first operational amplifier 48 serves to reduce the input impedance of the circuit, and has a gain large enough to provide a sufficiently high charge transfer efficiency; its feedback capacitor 64 is larger than the capacitance C2 of a secondary electrode when in a fully overlapping relationship with the primary electrode; its input circuit has gate protection diodes 130 connected between the input circuit and the power supply circuit lines 60, 62; and the offset reduction switch 65 connected in parallel with the capacitor 64 is closed temporarily at the beginning of each measurement cycle. This amplifier and the associated capacitor 68 together function as a charge pumping means.

(2) the second operational amplifier 50 serves as a charge accummulator. In each clock period, during the positive phase thereof the capacitor 68 is charged with the same charge as the in-use secondary electrode 20, the switches 70, 72 or 74, 76 then being closed; and during the negative phase the charge on the capacitor 68 is transferred to the charge accummulating capacitor 66, the switches 72 and 78 then being closed. The capacitance of the capacitor 68 should be as small as possible, and the capacitance of the capacitor 66 should be at least as large as that of the capacitor 68 to avoid exceeding the voltage swing of the amplifier 50. The gain of the amplifier should likewise be high enough to provide the desired charge transfer efficiency.

(3) the switches 70, 72, 74, 76 constitute a charge modulator, and operate to cause the charge of the capacitor 68 to be added to that of the capacitor 66 if during the positive clock phase the switches 70 and 72 are closed, and to be subtracted from the charge on the capacitor 66 if during that positive phase the switches 74 and 76 were closed instead.

(4) the comparator 54 determines the charge so far gathered compared to a virtual zero, provided by the line 56, and energises the delayed flip-flop 55 accordingly so as to supply the terminal 80 with a voltage of one polarity or the other.

To ensure identical voltages being applied to the two in-use secondary electrodes in turn, the electrode selecting switches 32-38 are preferably executed using CMOS technology so as to avoid offset problems.

The counters 92 and 94 are preferably arranged to count up to a datum level of 1024, or 2048 if greater resolution is required. (In an alternative arrangement, the counters may be arranged to count downwards from a base level of 1024, or 2048, towards a zero datum level.)

The smaller count N2 will always be related to the fully overlapping secondary electrode C2, whilst the larger count N1 will be related to the partially overlapping secondary electrode C1.

Thus, in evaluating the expression $x/a = (N1 - N2)/N1$, inverting the smaller count N2 relative to the datum value will give the value $(N1 - N2)$, and dividing that value by the datum value will give the value of '$x/a$'.

The selector 96 is advantageously constituted as a series of simple two-input OR gates, one for each bit of the datum value, the first inputs of the respective OR gates being connected to receive the respective bits of the counter 92, and the second inputs of the respective OR gates being connected to receive the respective bits of the other counter 94. Since the bits of the counter first reaching the datum value (1024, or 2048) will all be zeros, the output bits of the OR gate will be the bits supplied by the other counter and will give the smaller count for use in evaluating the expression $x/a=(N1-N2)/N1$ in the manner referred to above. A signal identifying the counter first reaching the datum value provides the displacement direction signal.

The multiplier 98 is arranged to convert the output provided by the selector 96 to a value corresponding to the chain-dotted linear characteristic 24 of FIG. 2. In this connection, it is advantageous in determining the values of the electrode parameters, to choose for the secondary electrodes a width 'a' and a separation distance 'h' according to the relationship 'a=15h', since the multiplier 'a/(a+h)' then becomes '15/16', which as '(16−1)/16' can be evaluated by adding the number 16 to the negative number (−1) and shifting the result over four bit positions. This facilitates multiplication with the minimum of equipment.

It will be appreciated that when the apparatus is in operation, (a) each measurement period or cycle will comprise a number of clock periods in the range 1024 to 2048 (or 2048 to 4096 where greater resolution is required), (b) that in each clock period the status of the up/down counter 44 will determine the pair of secondary electrodes to be used, and (c) that the sign of the potential appearing at the input to the delayed flip-flop 55 towards the end of a clock period will determine the output of the delayed flip-flop 55 in the next clock period and hence the secondary electrode (left or right) of the selected pair that will be energised in that next clock period.

During the initial clock period of a measurement cycle, the secondary electrode 20 having full overlap with the primary electrode 18 (for example, the left hand electrode of the selected pair) will (preferably, but not necessarily) be the first to be energised so as to supply charge to the primary electrode through the capacitance C2 of that electrode combination.

At the end of that clock period, the potentional appearing at the energisation terminal 80 will be such as to cause the left/right changeover circuit 46 to select the adjacent (e.g. right hand) secondary electrode having the smaller overlap with the primary electrode for counter-energisation during the next clock period, and to cause the reversal of the connections of the capacitor 68 of the charge modulator 52 relative to the output of the amplifier 48 during the positive phase of the next clock period.

Thus, during that next clock period, as a result of the reversal of the charge supplied to the capacitor 68 during the positive clock phase, charge is withdrawn from the primary electrode 18 via that right hand secondary electrode 20, through the smaller capacitance C1 of that electrode combination, during the negative clock phase.

Since for the same voltage, the charge so withdrawn is less than the charge supplied initially to the primary electrode, at the end of the second clock period the potential appearing at the terminal 80 has not reversed in sign, so that the changeover circuit 46 maintains the right hand secondary electrode for energisation during the next clock period.

Thus, during this third clock period further charge is withdrawn from the primary electrode via the right hand secondary electrode (capacitance C1). Should the same conditions apply at the end of the third clock period, the right hand secondary electrode is maintained for the fourth clock period, when further charge will be withdrawn from the primary electrode via the right hand secondary electrode.

However, if at the end of the third clock period the potential at the terminal 80 has reversed in sign, the left/right changeover circuit 46 operates to transfer the energisation of the primary electrode once more to the left hand secondary electrode, and to cause the capacitor 68 to be energised in a manner such that during the next negative clock period charge is again supplied to the primary electrode through the capacitance C2.

Each time the primary electrode is supplied with charge, the counter 92 increases its count by 'one', and each time charge is withdrawn from the primary electrode the counter 94 increases its count by 'one'. This process is repeated until the counter with the higher count reaches the datum value 1024, whereupon the count of the other counter is terminated, and the apparatus operates, as mentioned above, to provide a displacement direction signal according to whichever of the two counters reaches the datum count first, and a displacement magnitude signal dependent on the magnitude of the smaller count.

If desired, the secondary electrode system may comprise only three of the four secondary electrodes shown in the FIGS. 1 and 2, the electrode selecting means 28 having in that case only the corresponding three of the four switches 32 to 38.

The secondary electrode system may be extended as desired by adding on either side one or more further similar sets of secondary electrodes, and arranging for the electrode switching means 28 to be switched progressively along the length of that extended secondary electrode array as required by the increased/decreased relative displacement of the primary and secondary electrode systems.

Alternatively, the primary electrode system may be repeated, with switching means arranged to switch appropriately from one primary electrode to the next as the magnitude of the displacement changes.

Figure 3:
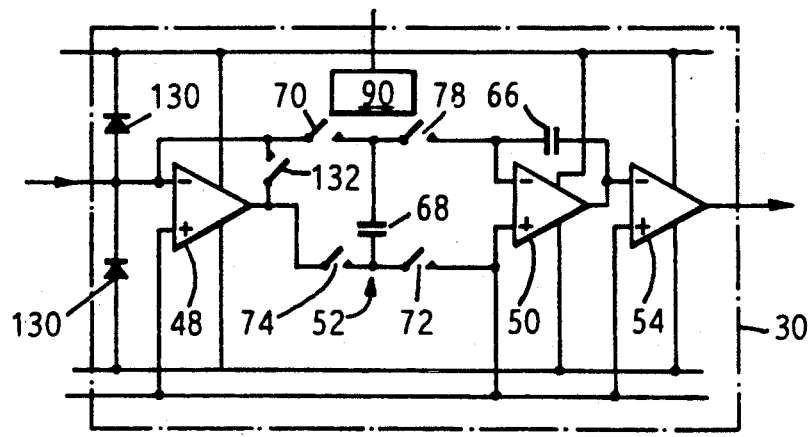
FIG. 3 shows a schematic electrical diagram of a modified form of a charge pumping circuit which forms part of the system of FIG. 1.

In a modification of the charge producing circuit 30, the connections which include respectively the offset reduction switch 65 and the switch 76 have been omitted; the feedback capacitor 64 has been replaced by a direct connection; and the output of the amplifier 48 has been connected to the switch 70 by a switch 132 instead of through a direct connection. Such a modified charge producing circuit is shown in the FIG. 3.

With that modified circuit, switches 132, 78 and 72 are first closed together in the positive clock phase, and after opening them subsequently, the switches 70 and 74 are closed in the negative clock phase.

In the positive clock phase, closure of switch 132 is used to set the voltage on the primary electrode at that of one of the supply lines 60 and 62 without swinging the output of the amplifier 48, which remains at the virtual zero of line 56. Whilst the switches 132, 78 and 72 are all closed, the charge on capacitor 68 is transferred to capacitor 66, but a charge corresponding to the offset of the amplifier 50 remains on the capacitor 68.

In the negative clock phase, with the switches 70 and 74 closed, the input to the amplifier 48, derived from the relevant secondary electrode, will move either positively by the supply source voltage 60–62, or negatively by the same amount, depending on the current polarity of the charge accumulated on the capacitor 66. Thus, the charge across the capacitor 68 will be changed by the product of the positive supply voltage (+v) and the capacitance of C1, or the product of the reversed supply voltage (−V) and the capacitance of C2.

Whilst in the above example, the electrode system used have been planar electrodes arranged for movement in their respective spaced planes, in other displacement measurement systems according to the present invention, the electrode systems are spaced around cylindrical paths and are arranged for relative movement around such cylindrical paths, so that rotational displacement can be measured.

In a further modification of the electrical system of FIG. 1, the primary electrode 18 is connected instead to the energisation terminal 58, whilst the switches 32 to 38 are replaced by drivers which are capable of applying the supply voltage of one polarity or the other to the selected secondary electrodes 20, the drivers being controlled by the selector electrodes 20, the drivers being controlled by the selector 40 in accordance with the polarity of the output of the delayed flip-flop 55 and the signals received from the up/down counter 44.

Preferably, the primary and secondary electrode systems are made by printed circuit techniques, and the electrode systems each comprise a plurality of similar electrodes connected in parallel in known manner to minimise the possibility of errors due to misalignment of the electrode systems (which will vary the separation 'd' between the electrode systems).

The technique of the present invention may be used to measure the ratio of the capacitances of two capacitors having primary and secondary electrodes, by connecting the two primary electrodes together to form in effect a single primary electrode, and then pumping charges into the primary electrode through one secondary electrode and subsequently withdrawing charge from the primary electrode through the other secondary electrode in the manner described above, to determine the ratio (N1−N2)/N1, and hence the ratio of the two capacitances.

The method of the present invention may be used to measure any parameter that can be related in some predetermined way with changes in the capacitance of a capacitor system. For example, the system may measure pressure (directly or indirectly) or rotation.

In the system described above, the ideal, high resolution measurement period is determined by the time taken for the number of charge packets (and hence the total charge) withdrawn from the primary electrode via the secondary electrode having the smaller variable capacitance C1 to equal the number of charge packets (and hence the total charge) supplied to the primary electrode via the secondary electrode having the larger, constant capacitance C2.

That measurement period would in practice be quite substantial and variable, so that the number of measurements that could be made in a given time interval is severely limited and uncertain. For example, with a resolution of 1/4000 of the dimension of a secondary electrode, a twelve bit resolution (i.e. two to the power of twelve=4096) is required. This means that that the sum of the counts (N1+N2) at the end of a measurement cycle can vary between 6144 and 8192. With a clock frequency of 30 kHz, only some four to six measurements can be made per second, which is clearly not sufficient for some industrial applications.

Hence, in the practical system disclosed in the FIG. 1, the measurement period is curtailed at a value that will permit the making of measurements at a relatively high repetition rate. Such a rate is made possible by restricting at a predetermined level (for example, at 'two to the power eight'=256) the counting of the charge packets (N1) withdrawn from the primary electrode. However, the disadvantage of such a curtailment of the counting period is that the resolution of the systems and the accuracy of measurement is not as high as in the ideal case referred to above.

As a consequence of that curtailment, there is at the end of the measurement period a finite net amount of charge that has been supplied and withdrawn, which residual charge is less than the value (V·C2), and is related to the lower-order bits (binary digits) of the desired measurement.

According to another feature of the present invention, that net charge is determined by applying to the secondary electrode having the larger, constant capacitance (C2) during successive clock periods successive voltage pulses of progressively diminishing magnitude, each such pulse having a sense dependent upon the sense of the net charge still present on the primary electrode and being directed to reducing that net charge still further towards zero value, and the successive voltage pulses diminishing inversely in dependence upon the value '2' raised to the power of 'x', where 'x' has successive values 1, 2, 3, 4, 5, 6, etc., (i.e. in a bit-wise progression).

Thus, whereas in the system of FIG. 1, the charge packets supplied to and withdrawn from the primary electrode 18 were determined by the output voltage 'V' of the delayed flip-flop device 55, that voltage is reduced for successive voltage pulses by the successive multipliers ½, ¼, ⅛, 1/16, 1/32, etc. Such voltages are readily obtained from a Digital-to-Analogue Converter ('DAC') driven by appropriate digital input signals.

Figure 4:
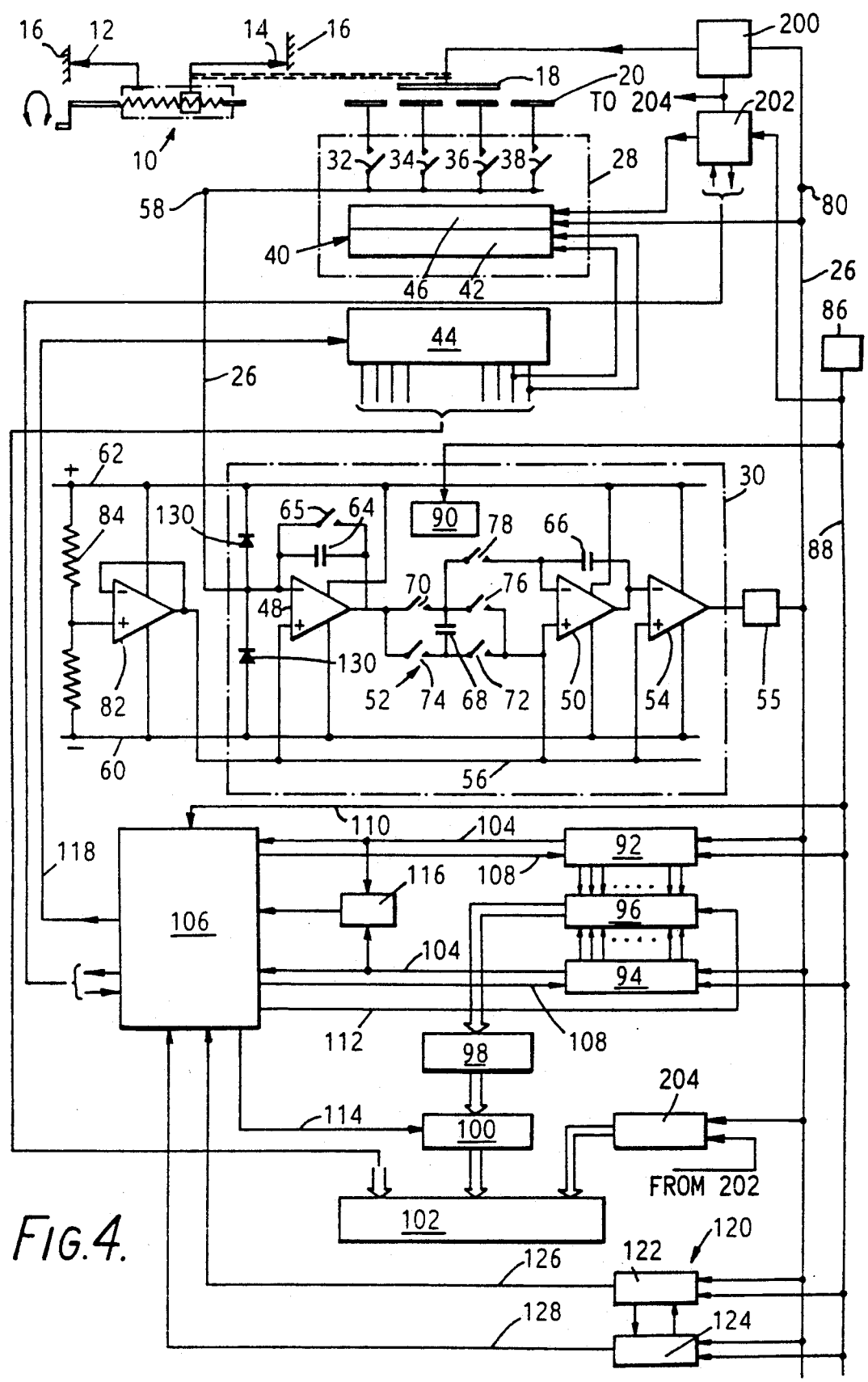
FIG. 4 shows a schematic diagram of a modified version of the system shown in FIG. 1.

Such a modified version of the system of FIG. 1 is shown in the schematic diagram of FIG. 4.

Referring now to FIG. 4, the output of the delayed flip-flop 55 is connected to the input of a 'DAC' 200 and determines the sense of the output voltage of the 'DAC'. The output circuit of the DAC is connected to the primary electrode 18 and supplies to that electrode a voltage whose magnitude is determined by a digital input signal supplied to the DAC 200 control device 202, which in turn receives its input signals from the logic unit 106 and the clock pulse generator 86.

The DAC control device 202 has two further output circuits which are connected respectively to further input circuits of the 'left-right' changeover means 46 and the logic unit 106 respectively.

This additional circuitry functions in the following manner to improve the resolution of measurements made by the apparatus of FIG. 1.

During the initial phase of a full measurement sequence, (that is, during the measurement cycle as described with reference to the FIG. 1), the DAC supplies the constant voltage pulses of magnitude 'V' to the primary electrode 18, in a sense as determined by the sense of the output of the delayed flip-flop 55.

When during the said initial phase of a measurement sequence, one of the counters 92, 94 reaches the preset datum value and signals this condition to the logic unit 106 via the relevant counter output circuit 104, the logic unit 106 thereupon supplies to the DAC control device 202 respective control signals, which signals serve to (a) identify the counter 92, 94 which reached the datum value, and (b) initiate the automatic generation in successive clock periods of progressively diminishing digital signals.

In response to the counter-identifying signal, the DAC control device 202 supplies to the 'left-right' changeover means 46 a signal for selecting the secondary electrode which fully overlaps the primary electrode 18 and thus has its maximum capacitance (C2) therewith.

In response to the successive digital input signals, the DAC 200 supplies to the primary electrode 18 in successive clock periods successive voltages of magnitudes (V·½); (V·¼); (V·⅛); (V·1/16); (V·1/32); (V·1/64); (V·1/128); and (V·1/1256), where V is the output voltage provided by the DAC 200 during the earlier phase (dual slope) of the measurement sequence.

The sense of the DAC output voltage is determined by the sense of the output voltage of the flip-flop 55, which operates during this second phase of the measurement sequence in the same manner as in the earlier phase of the sequence, that is to provide a signal whose sense is determined by the sense of the net value of the charge supplied to and withdrawn from the primary electrode 18 via the two secondary electrodes.

Thus, after one of the counters 92, 94 has reached the datum value, the DAC applies a voltage of magnitude (V·½) to the primary electrode 18, the secondary electrode 20 having constant maximum capacitance C2 being connected through its switch 32-38 with the input terminal 58 of the charge pumping circuit 30. The sense of that voltage, determined by the output of the flip-flop 55, is such as to reduce the magnitude of the net charge at the primary electrode towards zero value. In the event that that voltage pulse does not the sense of the flip-flop output voltage to change its sign, the DAC applies to the primary electrode 18 during the next clock period a voltage pulse of the same sense but of a magnitude (V·¼).

Likewise, in the event that that new voltage pulse does not cause the sense of the flip-flop output voltage to change its sign, the DAC applies to the primary electrode 18 during the next clock period a voltage pulse of the same sense but of a magnitude (V·⅛).

However, in the event that that voltage pulse causes the flip-flop output to reverse its sense (indicating that the net value of the charge supplied to and withdrawn from the primary electrode has changed its sign), the next DAC voltage pulse of (V·1/16) has a reversed sign, so that the net charge on the primary electrode is again reduced, in an opposite sense, towards zero value.

The sequence continues in like manner to apply to the primary electrode 18 successive voltage pulses of progressively diminishing values (V·1/32), (V·1/64), (V·1/128) and (V·1/256), the sign of such voltages being varied in accordance with the sign of the output of the flip-flop 55.

A monitoring unit 204 receives as input signals the control signals supplied by the DAC control device 202 to the DAC 200, and the output signal of the delayed flip-flop 55, and (a) maintains a tally of those control signals together with their respective signs (+/−) as determined by the flip-flop output during the associated clock periods, and (b) summates in respect of them the associated respective values ½, ¼, ... 1/256 according to the signs assigned to them. Thus, in effect the total period during which charge is supplied to the primary electrode 18 during a measurement sequence (and hence the dimension being measured) is represented by the expression (N2+the summation of that signed series ½, 174 , ... 1/256).

In the system of FIG. 4, if the value N2 is determined to the extent of eight binary digits before the decimal point by a counter 92, 94 having eight bits, the addition of the items 200, 202, etc. enables the accuracy of the system to be doubled in the sense that the eight digits in front of the decimal point are matched by the eight digits which follow the decimal point and are supplied by the monitoring unit 204.

The output of that monitoring unit 204 is supplied to the display unit 102 to provide an indication of the decimal digits appearing after the decimal point.

In the above-described embodiments of the present invention, during the determination of the value N2, the transport of charge to and from the primary electrode 18 has been effected in predetermined uniform packets under the influence of a predetermined constant applied voltage, and the respective counting means 92, 94 have been effective to add a count of one for each charge packet monitored. That is, each counter has a scale factor of unity.

The fundamental premise of the invention is, however, that measurement is achieved when at the end of the measurement cycle, the total charge withdrawn through the secondary electrode having the smaller capacity C1 is equal to the total charge supplied through the secondary electrode having its maximum capacity C2. That is to say $$(V \cdot N1 \cdot C1) = (V \cdot N2 \cdot C2),$$

which can be expressed in the alternative form:

$$(V \cdot N1) \cdot (C1) = (V \cdot N2) \cdot (C2).$$

From that, it will be appreciated that it is possible to use different voltages for supplying and withdrawing charge, provided that appropriate changes are made in the scale factors of the associated counters so as to compensate for the changes in the voltages that are used for supplying and withdrawing charge respectively.

For example, when charge is withdrawn from the primary electrode 18 under an applied voltage which is only one third of that used to supply charge to that electrode, the counter 92 has a scale factor of three compared with the unity scale factor of the counter 94. Hence, for each charge packet supplied to the primary electrode 18, the counter 92 registers an increase of three in its count. whereas for each charge packet withdrawn from that electrode, the counter 94 registers an increase of only one in its count.

Furthermore, it is possible to use different voltage magnitudes for supplying successive charge packets to the primary electrode 18, and different voltage magnitudes for withdrawing successive charge packets from that electrode, provided that appropriate changes are made in the scale factors of the respective counters 92, 94, so that the respective counters register only the total charge supplied to that electrode and the total charge withdrawn from that electrode.

In like manner, different time periods may be used for supplying and withdrawing charge respectively, provided that appropriate compensations are made in the scale factors of the respective counters 92, 94, so that they summate only the total charge supplied and withdrawn.

Whereas in the specific embodiments described above, the separation of the caliper anvils 12, 14 is adjusted by means of a screw device, that screw device may be replaced by any other means. For example, the anvils may be freely movable relative to one another by simple finger pressure.

It will be appreciated that with the system described with reference to the FIG. 1, the measurement sequence terminates, and the next measurement sequence starts, when one of the counters 92, 94 reaches the datum level. However, with the system described with reference to FIG. 4, the measurement sequence terminates, and the next measurement sequence starts, when the DAC sequence of progressively diminishing voltages has terminated.

It will also be appreciated that the extended measurement system and method described in the latter part of this specification can be applied in like manner to the measurement of two capacitors unrelated to the measurement of a mechanical displacement.

I claim:

1. A capacitive displacement measurement apparatus comprising primary and secondary electrode systems spaced transversely apart and mutually opposed, one of said electrode systems being displaceable relative to the other electrode system without changing the transverse spacing of the electrode systems, which apparatus is characterized by:

(a) said primary electrode system comprises a single primary electrode of plate form, and said secondary electrode system comprises two similar secondary electrodes of plate form which (i) are closely spaced apart, and (ii) together span fully or substantially so the whole of the primary electrode, thereby on relative displacement of said electrode systems there occurs a progressive reduction in the overlap of the primary electrode, first with one of said secondary electrodes and then with the second of said secondary electrodes;

(b) clock means for providing a succession of clock pulses defining successive clock periods;

(c) electric charge pumping means arranged when operating in a first mode to supply to the primary electrode via a first one of the secondary electrodes first predetermined packets of electrical charge during selected first clock periods so as to increase the electric charge on the primary electrode and, when operating in a second mode, to withdraw from the primary electrode via the second of the secondary electrodes second predetermined packets of electrical charge during selected second clock periods so as to decrease the electric charge on the primary electrode;

(d) charge monitoring means for monitoring the level of electric charge present on the primary electrode, and for causing the charge pumping means to operate in the first mode whenever at the end of one of said second clock periods the charge present on the primary electrode has fallen below a predetermined datum level, and to operate in the second mode whenever at the end of one of said first clock periods the charge present on the primary electrode has risen above said datum level;

(e) charge summating means for summating during each cycle during which a displacement measurement is made (i) the charge supplied to the primary electrode via the first secondary electrode, and (ii) the charge withdrawn from the primary electrode via the second secondary electrode, and for providing at the end of each measurement cycle electric signals N2 and N1 representing the respective summations of the charges supplied to and withdrawn from the primary electrode; and (f) signal converting means for converting the signals N1 and N2 into a displacement signal which is directly indicative of the relative displacement of said primary and secondary electrode systems.

2. An apparatus according to claim 1, further comprising a displacement direction device which is responsive to the two signals N1 and N2 and provides a displacement direction signal in dependence upon whichever of the two signals N1 and N2 is larger.

3. An apparatus according to claim 1, wherein the summating means is arranged to stop summating the charge supplied to and withdrawn from the primary electrode, and to terminate the measurement cycle, whenever one or the other of the two signals N1 and N2 first reaches a predetermined datum value, and to provide a direction signal according to whichever count first reaches the datum value, and a displacement signal dependent on the magnitude of the other, smaller count.

4. An apparatus according to claim 1, wherein the secondary electrode system includes at either end thereof other similar secondary electrodes which are spaced from adjacent secondary electrodes in like manner as the first and second secondary electrodes, and electrode switching means are arranged to connect the charge pumping means in succession to different pairs of secondary electrodes as the primary electrodes moves adjacent different pairs of adjacent secondary electrodes.

5. An apparatus according to claim 4, wherein the electrode switching means is arranged to transfer the charge pumping means from one pair of secondary electrodes to a next pair whenever the ratio of the count signals N1 and N2 moves through a predetermined datum value corresponding to a displacement of approximately one-half of the pitch of the secondary electrodes.

6. An apparatus according to claim 4, wherein means responsive to two signals progressively increasing towards the values N1 and N2, respectively, during any measurement cycle is arranged to produce a "rapid movement" signal whenever the ratio of those two signals exceeds a predetermined threshold value, of the order of three or four, which is indicative or a rapid change in the monitored displacement, and wherein that rapid movement signal is caused to increment or decrement, as appropriate, an output signal which is indicative of the monitored displacement by one secondary electrode pitch each time the ratio of those two signals exceeds the predetermined threshold value.

7. An apparatus according to any one of claims 1 and 2 to 6, wherein, after the end of each said measurement cycle, (a) said electric charge pumping means transports (that is, supplies or withdraws) electric charge in successive clock periods at progressively lower rates of charge transport; (b) said electric charge pumping means operates in either a third mode or a fourth mode, in which third mode said electric charge pumping means supplies charge to the primary electrode in selected third clock periods via said first secondary electrode, and in which fourth mode said charge pumping means withdraws charge from the primary electrode in selected fourth clock periods via said first secondary electrode; (c) said charge monitoring means causes the charge pumping means to operate in said third mode whenever at the end of one of said fourth clock periods the charge present on the primary electrode has fallen below a predetermined datum level and to operate in said fourth mode whenever at the end of one of said third clock periods the charge present on the primary electrode has risen above that datum level; and (d) said charge summating means summates the charge supplied to and withdrawn from the primary electrode via said first secondary electrode; and including an additional signal producing means responsive to the changes in mode and the rates at which said charge pumping means supplies charge to and withdraws charge from the primary electrode in said third and fourth modes, and produces therefrom a summation signal representative of the residual charge present at the primary electrode at the end of the preceding measurement cycle.

8. An apparatus according to any one of claims 1 and 2 to 6, wherein the said first predetermined packets of electrical charge and the said second predetermined packets of electrical charge are all of constant uniform magnitude, and the said charge summating means comprises a charge packet counting means arranged for counting during each predetermined displacement-measurement cycle the respective charge packets supplied to and withdrawn from the primary electrode to thereby provide at the end of each measurement cycle said electric signals N1 and N2.

9. An apparatus according to any one of claims 1 and 2 to 6, wherein the first and second packets of electrical charge are supplied/withdrawn, respectively, under the influence of respective different constant voltages.

10. An apparatus according to any one of claims 1 and 2 to 6, wherein the first and second packets of electrical charge are supplied/withdrawn, respectively, during respective time periods of respective different magnitudes.

11. A method of determining the displacement of an object, which method includes the step of providing primary and secondary electrode systems spaced transversely apart and mutually opposed, one of said electrode systems being displaceable with said object relative to the other electrode system without changing the transverse spacing of the electrode system, and the other electrode system being held stationary; and which method is characterized in that:
(i) said primary electrode system comprises a single primary electrode of plate form, and said secondary electrode system comprises two similar secondary electrode of plate form which (i) are closely spaced apart, and (ii) together span fully, or substantially, so the whole of the primary electrode, thereby on relative displacement of said two electrode systems there occurs a progressive reduction in the overlap of the primary electrode first with one of said secondary electrodes and then with the second of said secondary electrodes; and
(ii) the method comprises, in a measurement cycle comprising a number of clock periods, the steps of:
(a) supplying electric charge to the primary electrode via the first secondary electrode during a selected first clock period to thereby increase the electric charge on the primary electrode;
(b) withdrawing electric charge from the primary electrode during selected successive second clock periods via the second secondary electrode to thereby decrease the electric charge on the primary electrode;
(c) detecting when the sign of the electric charge on the primary electrode changes, and thereupon causing the steps (a) and (b) above to be repeated until after a number of clock periods the end of the measurement cycle has been reached;
(d) summating during the measurement cycle the charge supplied during the clock periods occupied by steps (a) and providing a signal N2 representative of that summated charge;
(e) summating during the measurement cycle the charge withdrawn during the clock periods occupied by steps (b) and providing a signal N1 representative of that summated charge; and
(f) determining at the end of each measurement cycle from the ratio (N1-N2)/N1 the value of the relative displacement of the secondary electrodes from their central starting position in which they span fully, or substantially so, the primary electrode.

12. A method according to claim 11, including the step of stopping the measurement cycle when the greater of the signal N2 and N1 reaches a predetermined datum level, and producing from the signal N1 or N2 reaching that datum level a first output signal indicating the sense of the displacement of the secondary electrodes from the central position, and from the value of the smaller signal a second output signal indicating the magnitude of the displacement.

13. A method according to claim 11, including, where the number of secondary electrodes is greater than two, the step of transferring from said first and second secondary electrodes to a different pair of adjacent secondary electrodes when the ratio of the signals N1 and N2 crosses a predetermined threshold value indicative of a displacement of approximately one-half the pitch of the secondary electrodes.

14. A method according to claim 11, including, under conditions of rapid displacement of the electrode systems, the step of changing an output signal indicative of the monitored displacement by one pitch of the secondary electrodes each time the ratio of the two signals progressively approaching the values N1 and N2, respectively, during any measurement cycle exceeds a predetermined high value, of the order of three or four.

15. A method according to any one of claims 11 to 14, wherein charge is supplied in the steps (a) and withdrawn in the steps (b) under a predetermined uniform voltage, said step (d) comprises counting during the measurement cycle the number of clock periods occupied by steps (a), and said step (e) comprises counting during the measurement cycle the number of clock periods occupied by steps (b).

16. A method according to any one claims 11 to 14, including, after the end of each said measurement cycle, the additional steps of:
(a) transporting electric charge in successive clock periods at progressively lower rates of charge transport, in either a third mode or a fourth mode, in which third mode said electric charge pumping means supplies charge to the primary electrode in selected third clock periods via said first secondary electrode, and in which fourth mode said charge pumping means withdraws charge from the primary electrode in selected fourth clock periods via said first secondary electrode;
(b) detecting when the sign of the electric charge on the primary electrode changes, and thereupon effecting a change from one of said third and fourth modes to the other of those modes to thereby progressively reduce the charge present at the primary electrode towards zero value; and (c) producing in response to said changes of mode and said progressively reducing transport rates a signal representative of the residual charge remaining on the primary electrode at the end of the preceding measurement cycle.

17. A method according to any one of claims 11 to 14, wherein the first and second packets of electrical charge are supplied/withdrawn, respectively, under the influence of respective different constant voltages.

18. A method according to any one of claims 11 to 14, wherein the first and second packets of electrical charge are supplied/withdrawn, respectively, during respective time periods of respective different magnitudes.

19. A capacitance ratio measurement apparatus for measuring the ratio of the capacitances of two capacitors, each having a primary electrode and a secondary electrode, which apparatus comprising:
(a) an electrical interconnection means interconnecting the respective primary electrodes of the two capacitors to thereby form a common primary electrode which is common to both of said capacitors;
(b) clock means for providing a succession of clock pulses defining successive clock periods;
(c) electric charge pumping means arranged when operating in a first mode to supply to said common primary electrode via a first one of said secondary electrodes first predetermined packets of electrical charge during selected first clock periods so as to increase the electric charge on said common primary electrode and, when operating in a second mode, to withdraw from said common primary electrode via the second of said secondary electrodes second predetermined packets of electrical charge during selected second clock periods so as to decrease the electric charge on said common primary electrode;
(d) charge monitoring means for monitoring the level of electric charge present on said common primary electrode, and for causing the charge pumping means to operate in the first mode whenever at the end of one of said second clock periods the charge present on said common primary electrode has fallen below a predetermined datum level, and to operate in the second mode whenever at the end of one of said first clock periods the charge present on said common primary electrode has risen above said datum level;
(e) charge summating means for summating during each cycle, during which a capacitance ratio measurement is made, (i) the charge supplied to said common primary electrode via said first secondary electrode, and (ii) the charge withdrawn from said common primary electrode via said second secondary electrode, and for providing at the end of each measurement cycle electric signals N2 and N1 representing the respective summations of the charges supplied to and withdrawn from said common primary electrode; and
(f) signal converting means for converting the signals N1 and N2 into a signal which is directly indicative of the ratio of the capacitances of the two capacitors.

20. An apparatus according to claim 19, wherein said first predetermined packets of electrical charge and said second predetermined packets of electrical charge are all of constant uniform magnitude, and said charge summating means comprises a charge packet counting means arranged for counting during each predetermined capacitance ratio measurement cycle the respective charge packets supplied to and withdrawn from said common primary electrode to thereby provide at the end of each measurement cycle said electric signals N2 and N1.

21. Apparatus according to claim 19 or 20, wherein the first and second packets of electric charges are supplied/withdrawn, respectively, under the influence of respective different constant voltages.

22. Apparatus according to claim 19 or 20, wherein the first and second packets of electrical charges are supplied/withdrawn, respectively, during respective time periods of respective different magnitudes.

23. A method of determining the ratio of the capacitances of two capacitors, each having primary and secondary electrodes, which method comprises:
(a) a step of electrically interconnecting the respective primary electrodes of the two capacitors to thereby form a common primary electrode which is common to both of said capacitors, and then in a measurement cycle comprising a number of clock periods further conducting the steps of:
(b) supplying electric charge to said common primary electrode via a first one of said secondary electrodes during a selected first clock period to thereby increase the electric charge on said common primary electrode;
(c) withdrawing electric charge from said common primary electrode during selected successive second clock periods via the second of said secondary electrodes to thereby decrease the electric charge on said common primary electrode;
(d) detecting when the sign of the electric charge on said common primary electrode changes, and thereupon causing the steps (b) and (c) above to be repeated until after a number of clock periods the end of the measurement cycle has been reached;
(e) summating during the measurement cycle the charge supplied during the clock periods occupied by steps (b) and providing a signal N2 representative of that summated charge;
(f) summating during the measurement cycle the charge withdrawn during the clock periods occupied by steps (c) and providing a signal N1 representative of that summated charge; and
(g) determining at the end of each measurement cycle from the ratio (N1−N2)/N1 the value of the ratio of the capacitances of the two capacitors.

24. A method according to claim 23, wherein charge is supplied in the steps (b) and withdrawn in the steps (c) under a predetermined uniform voltage, said step (e) comprises counting during the measurement cycle the number of clock periods occupied by steps (b), and said step (f) comprises counting during the measurement cycle the number of clock periods occupied by steps (c).

25. A method according to claim 23 or 24, wherein the first and second packets of electrical charge are supplied/withdrawn, respectively, under the influence of respective different constant voltages.

26. A method according to claim 23 or 24, wherein the first and second packets of electrical charge are supplied/withdrawn, respectively, during respective time periods of respective different magnitudes.

* * * * *

UNITED STATES PATENT AND TRADEMARK OFFICE
CERTIFICATE OF CORRECTION

PATENT NO. : 5,237,284
DATED : August 17, 1993
INVENTOR(S) : Rob Van Der Valk

Page 1 of 4

It is certified that error appears in the above-indentified patent and that said Letters Patent is hereby corrected as shown below:

On the Title Page, Item [57]:

Abstract, lines 1-23, delete the abstract as it appears on the patent and insert therefor -- A displacement measurement apparatus includes a primary electrode, and first and second secondary electrodes which are closely spaced apart and together fully span the primary electrode, the primary and secondary electrodes being movable relative to one another without increasing their transverse separation. A charge pumping means is arranged to supply electric charge to the primary electrode during selected first clock periods, and to withdraw charge from the primary electrode through the second secondary electrode during selected second clock periods. The changeover from one mode of operation to the other is made automatically when the sign of the charge on the primary electrode reverses, so that the charge on the primary electrode is successively increased, and then reduced to a low value. The numbers N1 and N2 of charge packets supplied to and withdrawn from the primary electrode during a measurement cycle are counted, and a displacement signal is produced in accordance with the relationship (N1-N2)/N1. The electrical system may also be used for determining in a similar manner the ratio of the capacitances of any two capacitors. --

UNITED STATES PATENT AND TRADEMARK OFFICE
CERTIFICATE OF CORRECTION

PATENT NO. : 5,237,284
DATED : August 17, 1993
INVENTOR(S) : Rob Van Der Valk

It is certified that error appears in the above-indentified patent and that said Letters Patent is hereby corrected as shown below:

In the Specification:

Column 1, line 61, change "displacable" to -- displaceable --.

Column 3, line 29, after "three" change "of" to -- or --.

Column 3, line 60, after "provided" delete the hyphen.

Column 4, line 5, change "displacable" to -- displaceable --.

Column 4, line 34, change "charges" to -- changes --.

Column 4, line 47, change "ration" to -- ratio --.

Column 6, line 13, change "displacable" to -- displaceable --.

Column 6, line 31, change "b-4.92 (31/160");" to -- b=4.92 (31/160"); --.

Column 6, line 38, after "which" insert -- it --.

Column 7, line 27, before "multiplier" insert -- a --.

Column 7, line 60, after "provide" change "and" to -- an --.

UNITED STATES PATENT AND TRADEMARK OFFICE
CERTIFICATE OF CORRECTION

PATENT NO. : 5,237,284
DATED : August 17, 1993
INVENTOR(S) : Rob Van Der Valk

It is certified that error appears in the above-indentified patent and that said Letters Patent is hereby corrected as shown below:

Column 11, line 40, change "potentional" to -- potential --.

Column 13, lines 17,18, after "by" delete "the selector electrodes 20, the drivers being controlled by".

Column 13, line 59, delete "that" (second occurrence).

Column 14, line 4, change "curailment" to -- curtailment --.

Column 14, line 6, change "systems" to -- system --.

Column 14, line 29, change "electode" to -- electrode --.

Column 15, line 68, change "174" to -- 1/4 --.

Column 16, line 48, after "count" change the period to a comma.

In the Claims:

Column 18, line 45, after "indicative" change "or" to -- of --.

Column 19, line 41, after "electrode" change "system " to -- systems --.

Column 19, line 47, change "electrode" to -- electrodes --.

UNITED STATES PATENT AND TRADEMARK OFFICE
CERTIFICATE OF CORRECTION

PATENT NO. : 5,237,284
DATED : August 17, 1993
INVENTOR(S) : Rob Van Der Valk

It is certified that error appears in the above-indentified patent and that said Letters Patent is hereby corrected as shown below:

Column 20, line 50, before "claims" insert -- of --.
Line 1

Column 22, line 53, before "(b)" change "the steps" to -- step --, and before "(c)" change "the steps" to -- step --.

Column 22, line 56, before "(b)" change "steps" to -- step --.

Column 22, line 58, before "(c)" change "steps" to -- step --.

Signed and Sealed this

Twelfth Day of July, 1994

Attest:

BRUCE LEHMAN

Attesting Officer

Commissioner of Patents and Trademarks